United States Patent
Bal et al.

(10) Patent No.: US 8,854,086 B1
(45) Date of Patent: Oct. 7, 2014

(54) CLOCK DISTRIBUTION SYSTEMS FOR LOW POWER APPLICATIONS

(71) Applicant: Integrated Device Technology, Inc., San Jose, CA (US)

(72) Inventors: Jagdeep Bal, Saratoga, CA (US); Cheng Wen Hsiao, San Jose, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 24 days.

(21) Appl. No.: 13/795,828

(22) Filed: Mar. 12, 2013

(51) Int. Cl.
*G06F 1/08* (2006.01)
*H03K 3/012* (2006.01)

(52) U.S. Cl.
CPC .................................... *H03K 3/012* (2013.01)
USPC .............................. 327/99; 327/108; 327/143

(58) Field of Classification Search
USPC ........... 327/99, 108, 142, 143, 198, 407, 544; 713/320, 322, 340
See application file for complete search history.

(56) References Cited

U.S. PATENT DOCUMENTS

| 6,876,263 | B1* | 4/2005 | Li et al. ........................ 331/49 |
| 7,071,768 | B2 | 7/2006 | Abe et al. |
| 8,095,813 | B2 | 1/2012 | Pernia et al. |

\* cited by examiner

*Primary Examiner* — Long Nguyen
(74) *Attorney, Agent, or Firm* — Myers, Bigel, et al.

(57) ABSTRACT

Integrated circuit devices include first and second periodic signal generators and a power down detection circuit. The first periodic signal generator is configured to generate at least a first periodic signal having a first frequency at an output thereof and the second periodic signal generator is configured to generate a second periodic signal having a second frequency less than the first frequency at an output thereof. The power down detection circuit is configured to selectively provide one or the other of the first and second periodic signals to an output terminal of the integrated circuit device, in response to monitoring a status of a signal received at an input terminal of the integrated circuit device. This received signal reflects a power down status of an external device that receives the selected one of the first and second periodic signals.

20 Claims, 3 Drawing Sheets

US 8,854,086 B1

CLOCK DISTRIBUTION SYSTEMS FOR LOW POWER APPLICATIONS

FIELD OF THE INVENTION

The present invention relates to integrated circuit devices and systems and, more particularly, to integrated circuit devices and systems that utilize clocks to synchronize timing of operations therein.

BACKGROUND OF THE INVENTION

Frequency references provided by oscillators are required in every clocked electronic system, including communication circuits, microprocessors, and signal processing circuits. Oscillators frequently consist of high performance piezoelectric crystals, such as quartz oscillators. The advantages of quartz oscillators are their stable operating frequency and high quality factor. However, the disadvantages of quartz oscillators are their relatively large size and unsuitability for high integration with electronic circuitry (e.g., CMOS circuits). To address these limitations of quartz oscillators, integrated clock chips have been developed to perform various clock generation functions, which can frequently substitute for multiple quartz oscillators within an integrated circuit system.

Unfortunately, in contrast to crystal oscillators, which can automatically shut off in the absence of stimulus, clock chips typically maintain at least one clock as active even when an integrated circuit device(s) receiving the clock has entered a power-down mode of operation. Accordingly, systems using integrated clock chips may consume excessive levels of power during power-down modes of operation relative to otherwise equivalent systems using one or more quartz-based oscillators.

One example of an integrated circuit system that is configured to suspend clock generation during a standby mode of operation is disclosed in U.S. Pat. No. 7,071,768 to Abe et al. Another example of an integrated circuit system that is configured to support power conservation during standby modes of operation is disclosed by FIGS. 36-40 of U.S. Pat. No. 8,095,813 to Pernia et al., entitled "integrated Circuit Systems Having Processor-Controlled Clock Signal Generators Therein That Support Efficient Power Management," the disclosure of which is hereby incorporated herein by reference. In particular, FIG. 36 of the '813 patent to Pernia et al. discloses input and output terminals 1205, 1210 of an integrated circuit 180 that receive and generate respective clocks having opposite phases (e.g., 180° out-of-phase). As shown by FIG. 36, an inverting buffer 1225 may be provided to generate an outgoing clock at output terminal ($X_{OUT}$) 1210 in response to an incoming clock received at input terminal ($X_{IN}$) 1205. This incoming clock may be generated by an up-stream clock generating apparatus 1100. The inverting buffer 1225 may be configured as illustrated by FIG. 1E herein, where the output signal X2_5 is generated in response to the input signal X1_5 when the buffer is "ON" (Case 5).

Moreover, as will be understood by those skilled in the art, the periodic nature of the outgoing clock may be suspended in response to a power-down mode of operation within the integrated circuit 180, which may suspend power to the inverting buffer 1225. Nonetheless, because the inverting buffer 1225 may enter one of a plurality of potential "inactive" states as illustrated by FIGS. 1A-1D (Case 1-Case 4), providing a periodic clock to the input terminal (e.g., X1_1, X1_2, X1_3 or X1_4) of the integrated circuit 180 may yield an undesired periodic or other fluctuating-type signal at the output terminal (e.g., X2_1, X2_2, X2_3 or X2_4), which may preclude detection of the power-down status of the integrated circuit 180 by the apparatus 1100.

SUMMARY OF THE INVENTION

Integrated circuit devices according to embodiments of the invention include first and second periodic signal generators and a power down detection circuit. The first periodic signal generator is configured to generate at least a first periodic signal having a first frequency at an output thereof and the second periodic signal generator is configured to generate a second periodic signal having a second frequency less than the first frequency at an output thereof. The power down detection circuit is configured to selectively provide one or the other of the first and second periodic signals to an output terminal of the integrated circuit device, in response to monitoring a status of a signal received at an input terminal of the integrated circuit device. This received signal is configured to reflect a power down status of an external device that receives the selected one of the first and second periodic signals.

According to further embodiments of the invention, a duty cycle of the second periodic signal is less than a duty cycle of the first periodic signal. The second periodic signal generator may include a pulse generator that generates the second periodic signal as a pulse train, in response to a third periodic signal having a frequency equivalent to the second frequency. The first and third periodic signals may have 50% duty cycles and a width of the pulses in the pulse train may be in a range from about 50 ns to about 150 ns. In some of these embodiments of the invention, the second frequency is in a range from about 500 Hz to about 2 KHz.

According to still further embodiments of the invention, the power down detection circuit includes a multiplexer having first and second input terminals responsive to the first and second periodic signals, respectively. The power down detection circuit may also include a pulse generator having an input responsive to the signal received at the input terminal of the integrated circuit device and an NMOS pull-down transistor having a gate terminal responsive to an output of the pulse generator.

A clock distribution system according to further embodiments of the invention includes a first integrated circuit having a crystal driver input terminal and a crystal driver output terminal, and a second integrated circuit. This second integrated circuit includes a first periodic signal generator, which is configured to generate at least a first periodic signal having a first frequency at an output thereof, and a second periodic signal generator, which is configured to generate a second periodic signal having a second frequency less than the first frequency at an output thereof. The second integrated circuit also includes a power down detection circuit, which is configured to selectively provide one or the other of the first and second periodic signals to the crystal driver input terminal, in response to monitoring a power down status of a signal generated at the crystal driver output terminal. The duty cycle of the second periodic signal may be less than a duty cycle of the first periodic signal. The second periodic signal generator may include a pulse generator, which is configured to generate the second periodic signal as a pulse train, in response to a third periodic signal having a frequency equivalent to the second frequency. The first and third periodic signals may have 50% duty cycles and a width of the pulses in the pulse train may be in a range from about 50 ns to about 150 ns. The second frequency may also be in a range from about 500 Hz to about 2 KHz. In some embodiments of the invention, the power down detection circuit includes a multiplexer having first and second input terminals, which are responsive to the first and second periodic signals, respectively. The power down detection circuit may also include a pulse generator having an input responsive to the signal generated at the crystal driver output terminal and an NMOS pull-down transistor having a gate terminal responsive to an output of the pulse generator.

DETAILED DESCRIPTION OF EMBODIMENTS

Figure 1A:
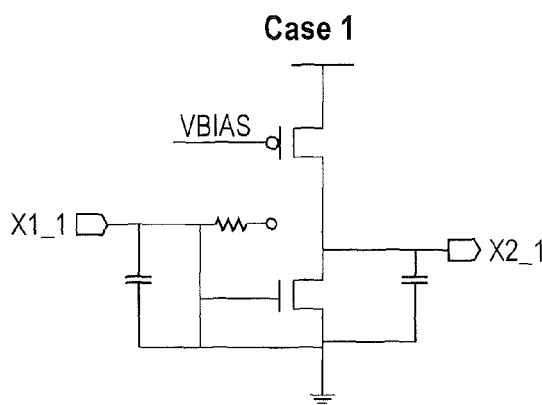
FIGS. 1A-1E are electrical schematics of inverting buffers according to the prior art.
Figure 1B:
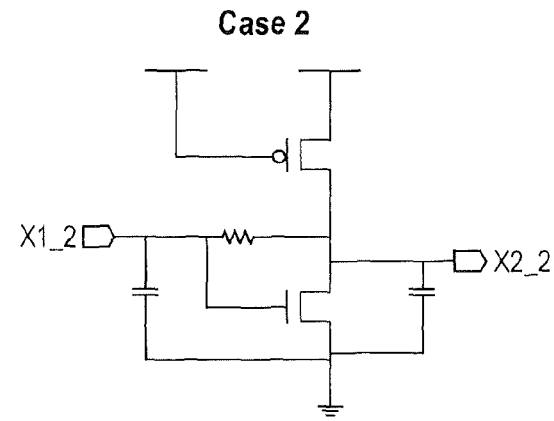
Figure 1C:
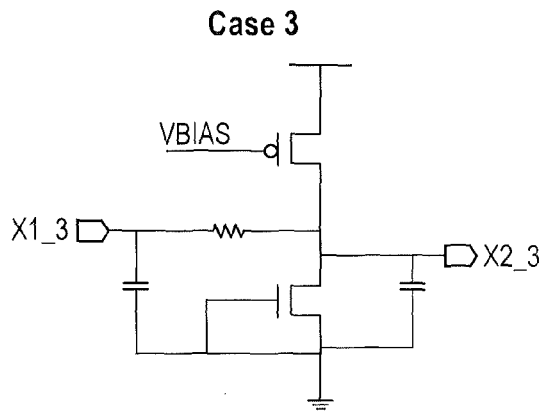
Figure 1D:
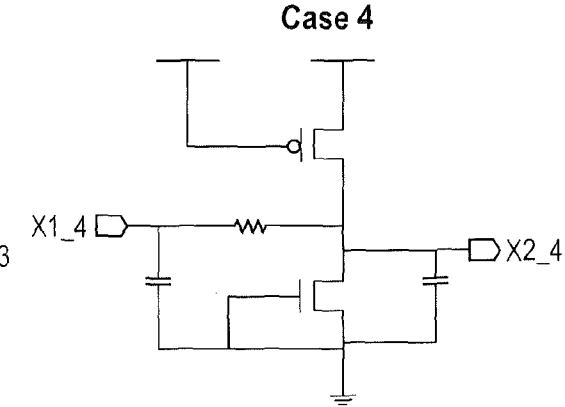

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
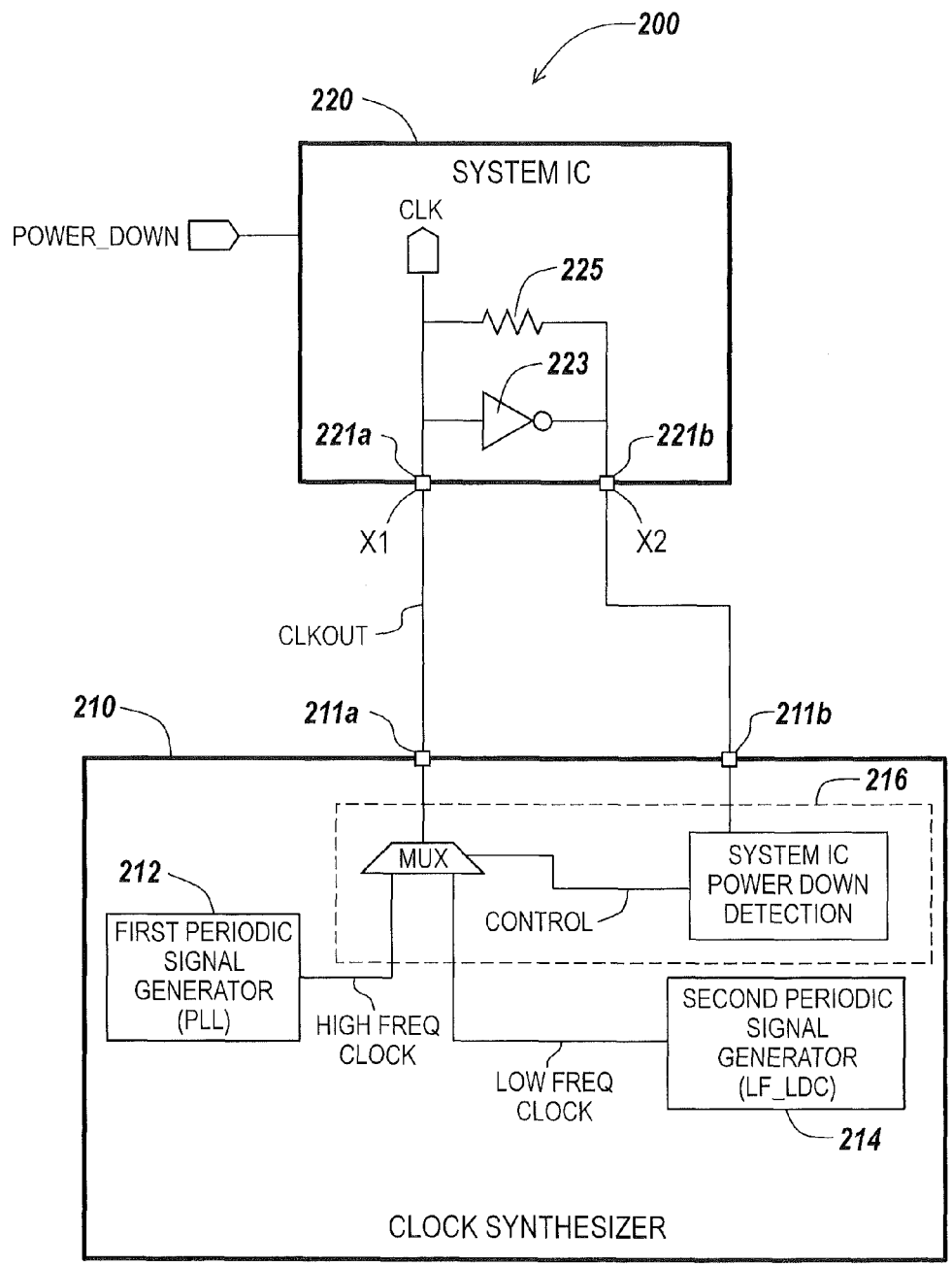
FIG. 2A is a block diagram of a clock distribution system according to an embodiment of the present invention.

Referring now to FIG. 2A, a clock distribution system 200 according to an embodiment of the invention is illustrated as including a network of at least two integrated circuits. One integrated circuit is illustrated as a clock synthesizer 210 and the other integrated circuit is illustrated as a system integrated circuit 220 (SYSTEM IC), which is responsive to, among other things, a power down signal (POWER_DOWN) and at least one clock (CLKOUT) generated by the clock synthesizer 210. This generated clock CLKOUT, which is produced at an output terminal 211a of the clock synthesizer 210 and received at an input terminal 221a (X1) of the system integrated circuit 220, may be used as an internal synchronizing clock CLK within the system integrated circuit 220. Moreover, when activated, the power down signal POWER_DOWN may be utilized to induce the system integrated circuit 220 into a power saving mode operation that suspends one or more power consuming operations therein.

Figure 1E:
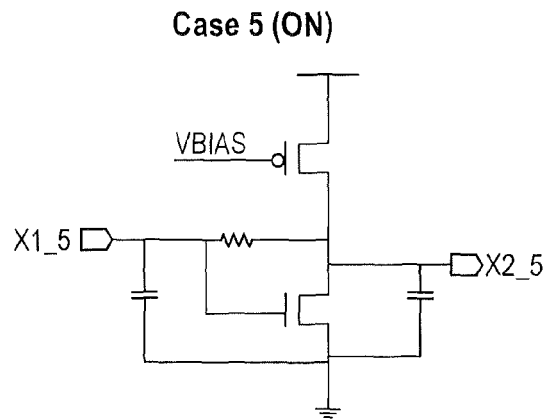

As illustrated, the system integrated circuit 220 may include a parallel network of a resistor 225 and an inverting "feedback" buffer 223 which, as highlighted by FIG. 1E, normally operate to generate an out-of-phase return clock at an output terminal 221b (X2) of the system integrated circuit 220. This resistor 225 may have a value in a range from about 400 KΩ to 1 MΩ, for example. As will be understood by those skilled in the art, the terminals X1 and X2, resistor 225 and inverting buffer 223 are configured to support signal feedback necessary for operation of an external piezoelectric crystal (not shown), which may be used to support the internal synchronizing clock CLK in the absence of a clock synthesizer 210.

The clock synthesizer 210 is illustrated as including a first periodic signal generator 212, which may contain a phase-locked loop (PLL) integrated circuit configured to generate a first periodic signal (e.g., high frequency clock), and a second periodic signal generator 214 configured to generate a second periodic signal (e.g., low frequency clock) having a frequency less than a frequency of the first periodic signal. As described more fully hereinbelow, the first periodic signal may be sufficient to operate as the internal synchronizing clock CLK within the system integrated circuit 220, whereas the second periodic signal generator 214 may be configured to generate the second periodic signal having a less than 50% duty cycle (LF_LDC), which is insufficient to operate as the internal synchronizing clock CLK. Nonetheless, the second periodic signal may be configured to provide a sufficient combination of frequency and duty cycle (i.e., active energy) to support switching of the inverting buffer 223 (when fully powered) when it is received at input terminal 221a (X1), but insufficient to generate any switching waveform at output terminal 221b (X2) when the power down signal POWER_DOWN is active and the buffer 223 is thereby disabled (see, e.g., FIGS. 1A-1D).

The clock synthesizer 210 also includes a power down detection circuit 216, which is configured to receive a signal from the input terminal 211b and generate a control signal to a select terminal of an internal multiplexer (MUX). As shown, the input terminal 211b of the clock synthesizer 210 is electrically coupled to the output terminal 221b (X2) of the system integrated circuit 220.

Figure 2B:
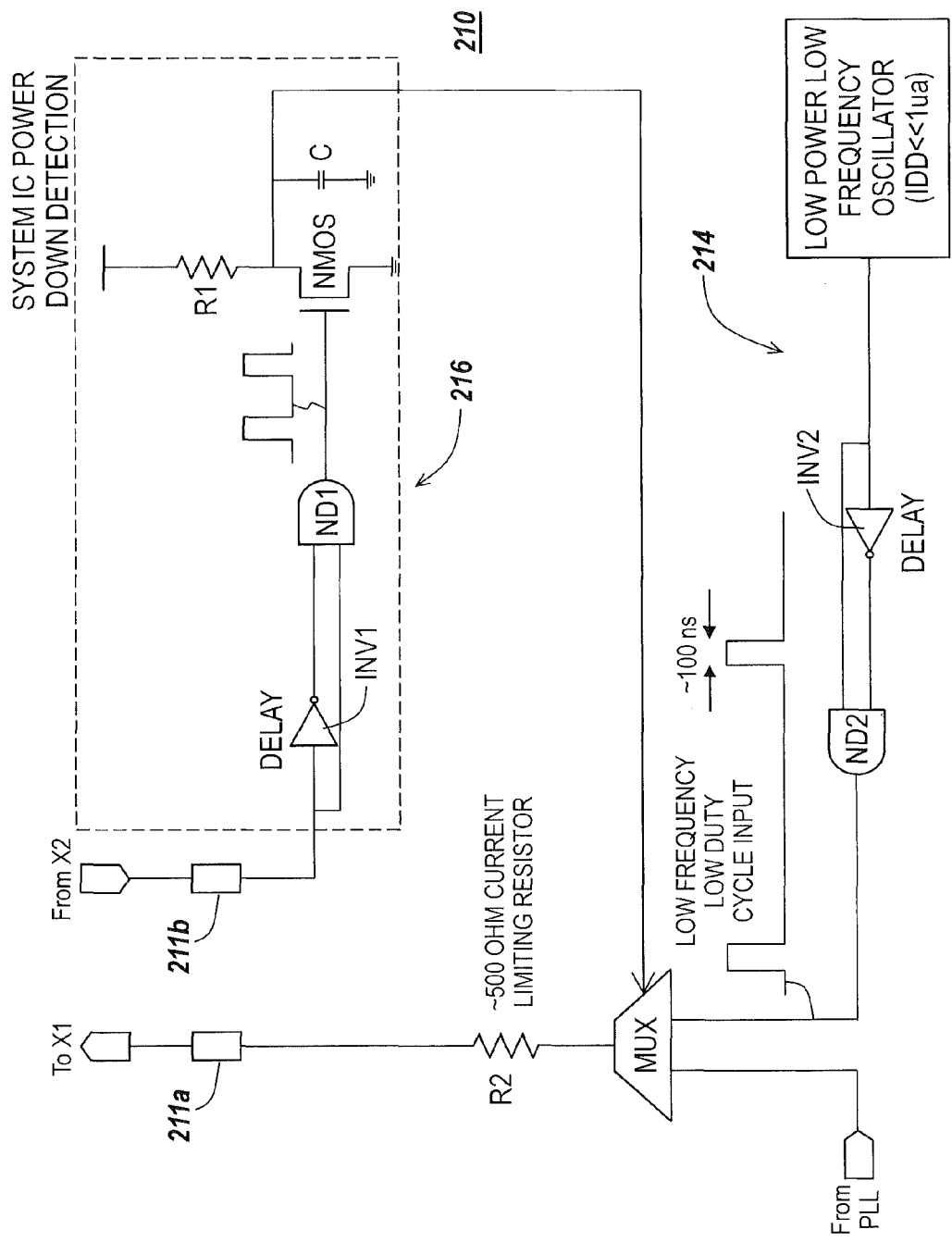
FIG. 2B is an electrical schematic of a portion of the clock synthesizer of FIG. 2A, according to an embodiment of the present invention.

Details of these aspects of the clock synthesizer 210 are further illustrated by FIG. 2B, which shows how a low power low frequency oscillator may be used to generate a low frequency periodic signal having a low duty cycle (<<50%). In particular, the second periodic signal generator 124 may utilize a delay element (INV2) and NAND gate (ND2) combination to generate a low frequency pulse train from a low power, low frequency oscillator (IDD<<1 μa), which generates a third periodic signal having a 50% duty cycle. This low frequency pulse train is provided from the output of the NAND gate (ND2) to an input terminal of the multiplexer (MUX), which also receives a relatively high frequency clock signal from the first periodic signal generator 212 (e.g., PLL).

As further illustrated by FIG. 2B, the power down detection circuit 216 utilizes a combination of an inverter (INV1), NAND gate (ND1), NMOS pull-down transistor, pull-up resistor (R1) and output capacitor C to detect when the system integrated circuit 220 has entered a power down mode of operation and also when the system integrated circuit 220 has reentered a full power mode of operation. As will be understood by those skilled in the art, during a full power mode of operation, the system integrated circuit 220 receives the relatively high frequency clock generated by the first periodic signal generator 212, via the multiplexer MUX and output terminal 211a. In addition, the feedback buffer 223 provides a similarly high frequency clock to output terminal 221b (X2), which is received as feedback by the input terminal 211b of the clock synthesizer 210. This high frequency "feedback" clock passes through the pulse generator defined by inverter INV1 and NAND gate ND1 as a relatively high frequency pulse train that turns on the NMOS pull-down transistor at a sufficient rate and duration to maintain a logic 0 voltage level across the output capacitor C, which drives the select terminal of the MUX to maintain pass-through of the selected high frequency clock from the first periodic signal generator 212.

However, once the system integrated circuit 220 switches from a full power mode of operation to a sufficiently reduced power down mode of operation, the output of the feedback buffer 223 will maintain a static DC voltage (e.g., logic 0) at the output terminal 221b and at the input terminal 211b. In response, the pull-up resistor R1 within the power down detection circuit 216 will hold the voltage across the output capacitor C at a logic 1 voltage level, which will cause the multiplexer to select the low duty cycle clock from the second periodic signal generator 214. Moreover, to prevent against the possibility that the voltage at the input terminal 211b may be held in an indeterminate state during the power down mode of operation and cause the input terminal 211b to float in a high impedance state, a weak positive feedback inverter (not shown) may be placed across the input/output terminals of the inverter INV1 to clamp the voltage the input terminal.

Although not shown, the selection of the low duty cycle clock may also be used to reduce power consumption within the first periodic signal generator 212 (PLL) and thereby render the clock synthesizer 210 more suitable for low power system applications (e.g., battery-powered applications). Preferably, the pulse train characteristics of the second periodic signal generator 214 are sufficient to force a logic 0 voltage level across the output capacitor C once full power resumes within the system integrated circuit 220 and the feedback inverter 223 becomes active to pass an inverted low frequency pulse train back to the input terminal 211b of the clock synthesizer 210. As explained hereinabove, the receipt of the inverted low frequency pulse train at input terminal 211b causes the power down detection circuit 216 to reselect the high frequency clock generated by the first periodic signal generator 212 for output at terminal 211a.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit device, comprising:
   a first periodic signal generator configured to generate at least a first periodic signal having a first frequency at an output thereof;
   a second periodic signal generator configured to generate a second periodic signal having a second frequency less than the first frequency at an output thereof; and
   a power down detection circuit configured to selectively provide one or the other of the first and second periodic signals to an output terminal of the integrated circuit device, in response to monitoring a status of a signal received at an input terminal of the integrated circuit device that reflects a power down status of an external device configured to receive the selected one of the first and second periodic signals.

2. The device of claim 1, wherein a duty cycle of the second periodic signal is less than a duty cycle of the first periodic signal.

3. The device of claim 2, wherein said second periodic signal generator comprises a pulse generator configured to generate the second periodic signal as a pulse train, in response to a third periodic signal having a frequency equivalent to the second frequency.

4. The device of claim 3, wherein the first and third periodic signals have 50% duty cycles.

5. The device of claim 3, wherein a width of the pulses in the pulse train is in a range from about 50 ns to about 150 ns.

6. The device of claim 5, wherein the second frequency is in a range from about 500 Hz to about 2 KHz.

7. The device of claim 1, wherein said power down detection circuit comprises a multiplexer having first and second input terminals responsive to the first and second periodic signals, respectively.

8. The device of claim 7, wherein said power down detection circuit comprises a pulse generator having an input responsive to the signal received at the input terminal of the integrated circuit device.

9. The device of claim 8, wherein said power down detection circuit further comprises an NMOS pull-down transistor having a gate terminal responsive to an output of the pulse generator.

10. A clock distribution system, comprising:
a first integrated circuit having a crystal driver input terminal and a crystal driver output terminal; and
a second integrated circuit, comprising:
- a first periodic signal generator configured to generate at least a first periodic signal having a first frequency at an output thereof;
- a second periodic signal generator configured to generate a second periodic signal having a second frequency less than the first frequency at an output thereof; and
- a power down detection circuit configured to selectively provide one or the other of the first and second periodic signals to the crystal driver input terminal, in response to monitoring a power down status of a signal generated at the crystal driver output terminal.

11. The system of claim 10, wherein a duty cycle of the second periodic signal is less than a duty cycle of the first periodic signal.

12. The system of claim 11, wherein the second periodic signal generator comprises a pulse generator configured to generate the second periodic signal as a pulse train, in response to a third periodic signal having a frequency equivalent to the second frequency.

13. The system of claim 12, wherein the first and third periodic signals have 50% duty cycles.

14. The system of claim 12, wherein a width of the pulses in the pulse train is in a range from about 50 ns to about 150 ns.

15. The system of claim 14, wherein the second frequency is in a range from about 500 Hz to about 2 KHz.

16. The system of claim 10, wherein the power down detection circuit comprises a multiplexer having first and second input terminals responsive to the first and second periodic signals, respectively.

17. The system of claim 16, wherein the power down detection circuit comprises a pulse generator having an input responsive to the signal generated at the crystal driver output terminal.

18. The system of claim 17, wherein the power down detection circuit further comprises an NMOS pull-down transistor having a gate terminal responsive to an output of the pulse generator.

19. The system of claim 12, wherein the power down detection circuit comprises a second pulse generator having an input responsive to the signal generated at the crystal driver output terminal.

20. The system of claim 19, wherein the power down detection circuit further comprises an NMOS pull-down transistor having a gate terminal responsive to an output of the second pulse generator.

* * * * *